United States Patent
Forbes

(10) Patent No.: US 6,346,858 B1
(45) Date of Patent: Feb. 12, 2002

(54) LOW POWER SUPPLY CMOS DIFFERENTIAL AMPLIFIER TOPOLOGY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/633,845

(22) Filed: Aug. 7, 2000

Related U.S. Application Data

(63) Continuation of application No. 09/209,330, filed on Dec. 11, 1998.

(51) Int. Cl.[7] .............................................. H03F 3/45
(52) U.S. Cl. ........................................ 330/258; 330/253
(58) Field of Search ................................ 330/253, 258, 330/259, 261

(56) References Cited

U.S. PATENT DOCUMENTS

| | | | |
|---|---|---|---|
| 4,345,213 A | 8/1982 | Schade, Jr. ................... 330/253 |
| 5,384,739 A | 1/1995 | Keeth ...................... 365/189.09 |
| 5,508,604 A | 4/1996 | Keeth .......................... 323/314 |
| 5,699,015 A | 12/1997 | Dotson et al. ............... 330/255 |
| 5,835,411 A | 11/1998 | Briner ..................... 365/185.21 |
| 5,838,200 A | 11/1998 | Opris .......................... 330/258 |
| 5,841,317 A | 11/1998 | Ohmori et al. .............. 327/563 |
| 5,862,077 A | 1/1999 | Briner ..................... 365/185.21 |
| 5,894,245 A | * 4/1999 | Cho ............................ 330/253 |
| 5,900,780 A | * 5/1999 | Hirose et al. ............... 330/253 |
| 5,959,492 A | 9/1999 | Khoury et al. ............. 327/389 |
| 6,040,720 A | 3/2000 | Kosiec ......................... 327/83 |
| 6,043,689 A | 3/2000 | Sheets, II et al. ........... 327/108 |
| 6,043,718 A | 3/2000 | Diniz et al. ................... 331/57 |

* cited by examiner

Primary Examiner—Robert Pascal
Assistant Examiner—Henry Choe
(74) Attorney, Agent, or Firm—Schwegman, Lundberg, Woessner & Kluth, P.A.

(57) ABSTRACT a structure and method for improving differential amplifier operation is provided. High performance, wide bandwidth or very fast CMOS amplifiers are possible using the new circuit topology of the present invention. The differential amplifier of he present invention employs a novel common mode feedback circuit to back bias the body regions of the amplifying transistors in the differential amplifier. The novel configuration is achieved entirely using CMOS fabrication techniques and delivers high performance in both amplifier gain (G) and frequency response (fT) characteristics using a 1 micron (1μ) CMOS technology.

24 Claims, 10 Drawing Sheets

LOW POWER SUPPLY CMOS DIFFERENTIAL AMPLIFIER TOPOLOGY

This application is a continuation of U.S. Ser. No. 09/209,330, filed Dec. 11,1998.

FIELD OF THE INVENTION

The present invention relates generally to electronic circuits. More particularly, it pertains to a structure and methods for low power supply differential amplifiers using a novel complementary metal oxide semiconductor (CMOS) topology.

BACKGROUND OF THE INVENTION

Decreasing power supply voltages in CMOS technology pose serious challenges in the design of analog integrated circuits and analog functions, e.g. analog differential amplification, when used conjunctively in digital integrated circuits. Power supply voltages in such integrated circuits have decreased from 5.0 V to 3.3 V and 2.5 V, with development work being done on dynamic random access memories (DRAMs) which use power supplies as low as 0.9 V.

The basic problem with using conventional analog differential and/or operational amplifiers in CMOS technology is two-fold. First high and variable values for threshold voltages (VT) plague the precision of transistor operation using 1 micron ($1\mu$) CMOS technology. This is the same $1\mu$ CMOS technology which is fundamental for low power operation. Second, the circuit configuration of a conventional amplifier is troublesome since the conventional amplifier requires stacking three devices one on top of each other. In its basic form, the three devices of the differential amplifier involve a current sink device, designed to provide common mode feedback and rejection, a pair of transistors for amplification, and a pair of load devices. Operation criteria demand that some significant overdrive, e.g., the excess in a transistor's gate to source potential (VGS) over the transistor's threshold voltage (VT), or (VGS-VT), is required in order to provide reasonable gain (G).

In addition to reasonable gain (G), another important performance criteria of the differential amplifier is the unity current gain frequency (fT). The unity current gain frequency, fT, depends on the transconductance (gm) of the amplifying transistor, and similarly depends on the overdrive, VGS-VT. To achieve reasonable values of transconductance and frequency response, VGS again must be significantly larger than VT. Generally, the unity gain frequency (fT) of a transistor is given by:

$$2\pi(fT)=gm/(Cgs+Cgd),$$

where Cgs is the gate to source capacitance for the transistor, Cgd is the gate to drain capacitance for the transistor, and gm is the transconductance of the transistor. The transeonductance, gm, is also generally expressed by:

$$gm=\mu C_o(W/L)(VGS-VT).$$

In the conventional differential amplifier configuration the current sink, designed to minimize common mode gain and provide a high common mode rejection ratio, poses one of the significant obstacles to low power operation. The obstacle is that a current sink, designed to minimize common mode gain and provide a high common mode rejection ratio, generally requires a significant voltage drop. As the electronics industry continues it's push for low power devices e.g. power supplies of less than 1.0 volt, the conventional differential amplifier in it's three device circuit stack form simply cannot provide acceptable performance.

Reserch into the above described problem has provided certain differential and/or operational amplifier configurations which operate with lower power supply voltages. For instance, Motorola has a patent and publication on a special combination of metal oxide semiconductor (MOS) technology and bipolar technology which produces an operational amplifier capable of operating with power supply voltages as low as 1.2 V. Unfortunately, the combined MOS/bipolar technology construction sacrifices the advantages to manufacturing in a streamlined, solely CMOS, technology process.

Another approach has produced CMOS amplifiers which can function with 1.2 V power supplies, but these operate only at very low frequencies below the megahertz (MHZ) range. Present performance criteria for dynamic random access memories (DRAMs), and other digital circuits which use CMOS amplifiers, requires operation at frequencies approaching the gigahertz (GHz) range. Given that differential amplifiers are normally required in DRAM sense amplifier circuits, then there is a requirement for low voltage differential amplifiers which operate not only in traditional analog integrated circuits but also digital integrated circuits like DRAMs. In this environment, low voltage differential amplifiers must satisfy reasonable gain (G) expectations and have high frequency response characteristics.

The constant reduction in power supply voltages presses the requirement to have differential amplifiers which can function at voltages lower than 1.0 V and still provide a high unity current gain frequency (fT) in the GHz range. Such amplifiers can be used as basic building blocks in analog circuits and for special functions in digital integrated circuits such as sense amplifiers.

For the reasons stated above, and for other reasons stated below which will become apparent to those skilled in the art upon reading and understanding the present specification, it is desirable to develop improved amplifiers which can be fabricated according to a CMOS process and which can operate at power supply voltages of 1.0 V and below. It is further necessary that such amplifiers supply sizeable gain (G) and have high frequency response characteristics.

SUMMARY OF THE INVENTION

The above mentioned problems with differential amplifier configuration and operation as well as other problems are addressed by the present invention and will be understood by reading and studying the following specification. Structures and methods are provided which accord exemplary performance.

High performance, wide bandwidth or very fast CMOS amplifiers are possible using the new circuit topology of the present invention. The differential amplifier of the present invention employs a novel common mode feedback circuit to back bias the body regions of the amplify transistors in the differential amplifier. The novel configuration is achieved entirely using CMOS fabrication techniques and delivers high performance in both amplifier gain (G) and frequency response (fT) characteristics using a 1 micron ($1\mu$) CMOS technology.

In one exemplary embodiment, the common mode feedback circuit is fabricated on a different portion of a semiconductor substrate apart from the amplifying transistors and load devices of the differential amplifier. Thus, the present invention avoids stacking, three high, the three principle circuit components of the differential amplifier.

The inventive common mode feedback circuit reduces high and variable values for threshold voltages (VT) which plague the precision of transistor operation using 1 micron (1µ) CMOS technology. The CMOS differential amplifier topology facilitates component transistor operation having low and stable threshold voltages (VT) of less than 0.1 V. In this manner, the CMOS amplifier delivers high performance criteria at very low power supply voltages, e.g., less than 1.0V. At these low power supply voltages unity voltage gain frequencies in excess of 1 GHz are achieved. Additionally, the CMOS differential amplifier topology of the present invention provides increased gain performance. The low threshold voltage (VT) values and low threshold voltage (VT) variance, facilitated by the novel common mode feedback circuit, yield significant differential gain (ADM) at low power supply voltages. The common mode signal of the present invention is reduced by the gain of the novel common mode feedback circuit (AFB), thus producing a low common mode gain (ACM) and a high common mode rejection ratio.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
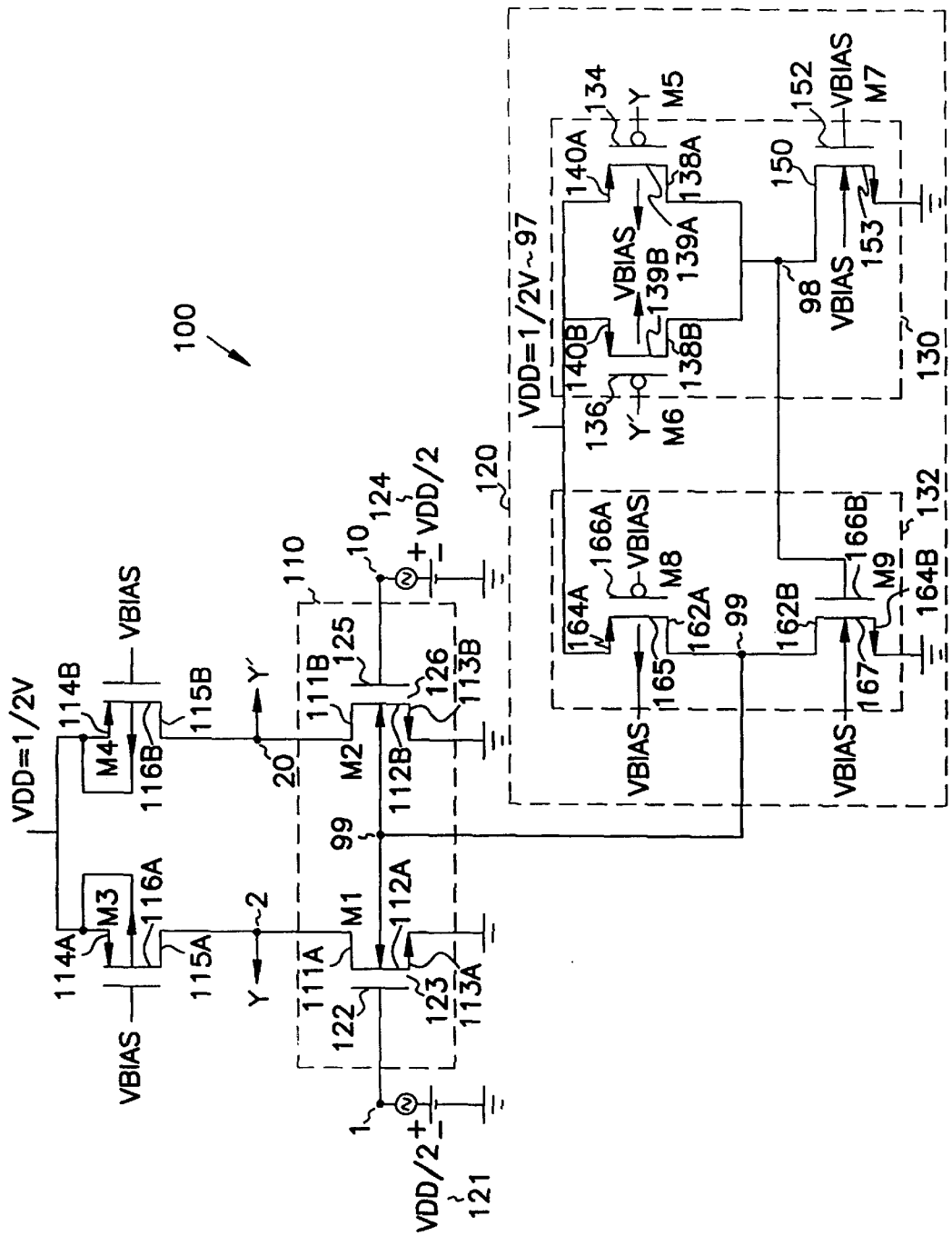
FIG. 1A is a schematic diagram illustrating an embodiment of a differential amplifier according to the teachings of the present invention.

In the following detailed description of the invention, reference is made to the accompanying drawings which form a part hereof, and in which shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Several illustrative embodiments of the present are provided below. One illustrative embodiment of the present invention includes a differential amplifier. The differential amplifier includes a first amplifying circuit which has a first transistor and a second transistor of a first conductivity type. Each transistor has a source region, a drain region, and body region. A pair of load devices are included in the differential amplifier and each load device couples to a drain region of a respective one of the first transistor and the second transistor. A first and a second output are included such that an output is coupled between a respective one of the pair of load devices and one of the drain regions for either the first transistor or the second transistor. A common mode feedback circuit includes an output which couples a bias to the body regions of the first and the second transistors.

In another embodiment, an analog circuit is provided. The analog circuit includes a first amplifying circuit which has a first transistor and a second transistor of a first conductivity type. Each transistor has a gate coupled to an input of the differential amplifier. A pair of load devices are included in the analog circuit. In one embodiment, the load devices include a third transistor and a fourth transistor of a second conductivity type. The third transistor couples at a drain region to the drain region of the first transistor. The fourth transistor couples at a drain region to the drain region of the second transistor. A first output is coupled between the first and third transistors. A second output coupled between the second and fourth transistors. A common mode feedback circuit couples a bias to the body regions of the first and the second transistors. The common mode feedback circuit includes a second and a third inverting/amplifying circuit.

In another embodiment, a signal processing circuit is provided. The signal processing circuit includes a first amplifying circuit which has a first transistor and a second transistor of a first conductivity type. Each transistor has a gate coupled to an input of the differential amplifier. A pair of load devices are included which comprise a third transistor and a fourth transistor of a second conductivity type. The third transistor couples at a drain region to the drain region of the first transistor, and the fourth transistor couples at a drain region to the drain region of the second transistor. A first output is coupled between the first and third transistors. A second output is coupled between the second and fourth transistors. A common mode feedback circuit is provided as part of the signal processing circuit. The common mode feedback circuit includes a second amplifying circuit that has a fifth transistor and sixth transistor, each transistor having a gate coupled to an output of the differential amplifier. The drain region for each transistor is coupled to a first common node, and the source region for each transistor is coupled to a second common node. The second amplifying circuit further includes a seventh transistor coupled at a drain region to the first common node. The common mode feedback circuit includes a third amplifying circuit which has the output to common mode circuit coupled between a drain region for an eighth transistor and the drain region of a ninth transistor. The source region of the eight transistor is coupled to the second common node of the second amplifying circuit The gate for the ninth transistor is coupled to the first common node of the second amplifying circuit. The first amplifying circuit and the pair of load devices are stacked as layers one on top of the other on a first portion of the a semiconducting substrate. The common mode feedback circuit is located on a second portion of the substrate.

In another embodiment, a method for forming a signal processing circuit is provided. The method includes forming a metal oxide semiconductor digital logic circuit, and concurrently fabricating a metal oxide semiconductor analog differential amplifier circuit.

In another embodiment, a method forming a signal processing circuit is provided. The method includes forming a metal oxide semiconductor digital logic circuit, and concurrently fabricating a metal oxide semiconductor analog differential amplifier circuit. Fabricating the metal oxide semiconductor analog differential circuit comprises fabricating a first amplifying circuit which has a first transistor and a second transistor of a first conductivity type. Each transistor has a source region, a drain region, and body region. A pair of load devices are fabricated such that each load device couples to a drain region of a respective one of the first transistor and the second transistor. A first and a second output are coupled to the differential circuit. The first and the second output are coupled, one each respectively, between one of the pair of load devices and one of the drain regions for either the first transistor or the second transistor. The method further includes fabricating a common mode feedback circuit such that the common mode feedback circuit includes an output which couples a bias to the body regions of the first and the second transistors.

In another embodiment, a method for operating a differential amplifier is provided. The method includes biasing a gate of a first MOSFET in a first amplifying circuit. A gate of a second MOSPET in the first amplifying circuit is biased. A first input signal is applied to the gate of the first MOSFET. A bias is coupled from an output of a common mode feedback circuit to a body region in each of the first and second MOSFETs.

In another embodiment, coupling a bias from an output of a common mode feedback circuit includes inputting a first and a second output from the differential amplifier to a first and second input, respectively, for the common mode feedback circuit The first and second output signals are inverted and amplified at a first stage of the common mode feedback circuit in order to provide a first feedback signal at a first node. The first feedback signal is inverted and amplified at a second stage of the common mode feedback circuit in order to provide second feedback signal as the bias at the output of the common mode feedback circuit In another embodiment, a single ingrated circuit is provided The single integrated circuit includes a digital logic circuit and an analog circuit The analog circuit includes the analog circuit presented and described above.

In another embodiment, an electronic system is provided. The electronic system includes a logic circuit, a memory circuit, and a differential amplifier circuit The differential amplifier circuit includes the differential amplifier circuit presented and described above and is coupled to the logic and memory circuit. A number of input/output (I/O) lines are included in the electronic system which are adapted for transmitting electronic data in the form of electronic signals between the logic circuit, the memory circuit and the differential amplifier.

FIG. 1A is a schematic diagram illustrating an embodiment of a differential amplifier 100, or analog device 100, according to the teachings of the present invention. In one embodiment, the differential amplifier 100 is a portion of an analog circuit or a signal processing circuit. FIG. 1A includes a first amplifying circuit 110. The first amplifying circuit 110 includes a first transistor M1 and a second transistor M2. Transistors M1 and M2 are of a first conductivity type. In one embodiment, the first conductivity type includes P-channel metal oxide semiconductor (PMOS) transistors. In an alternative embodiment, the first conductivity type includes N-channel metal oxide semiconductor (NMOS) transistors. The transistors M1 and M2 filer include a source region, 113A and 113B, a drain region, 111A and 111B, and a body region 112A and 112B.

A pair of load devices, M3 and M4, couple one to each drain region, 111A and 111B, respectively of the first transistor M1 and the second transistor M2. In one embodiment, the pair of load devices, M3 and M4, comprise a third transistor M3 and a fourth transistor M4. In this exemplary embodiment shown in FIG. 1A, the third transistor and the fourth transistor, M3 and M4, include a source region, 114A and 114B respectively, a drain region, 115A and 115B, and a body region, 116A and 116B. In this embodiment, the third transistor and the fourth transistor, M3 and M4 respectively, are a second conductivity type. In one exemplary embodiment, the second conductivity type includes P-channel metal oxide semiconductor (PMOS) transistors. In an alternative embodiment the first conductivity type includes N-channel met a oxide semiconductor (NMOS) transistors. In this exemplary embodiment, the third transistor and fourth transistor, M3 and M4, are independently fix-biased in an n-well CMOS process.

The differential amplifier of the present invention includes a first output 2 and a second output 20, also shown as Y and Y'. Each output, Y and Y', is coupled between one of the pair of load devices, M3 and M4, and the drain region 111A or 111B of a respective one of the first transistor M1 or the second transistor M2. FIG. 1A further illustrates that the differential amplifier includes a common mode feedback circuit 120. The common mode feedback circuit 120 includes an output 99 which couples a bias to the body regions, 112A and 112B respectively, of the first and second transistors, M1 and M2. The differential amplifier 100 includes a first DC source 121 coupled to a first gate 122 of the first transistor M1. The first gate 122 is separated from the body region 112A of the first transistor M1 by a gate oxide layer 123. In an exemplary embodiment, the gate oxide layer 123 is less than 100 angstroms in thickness. A first input 1 is coupled to the first gate 122 of the first transistor M1. A second dc source 124 is coupled to a second gate 125 of the second transistor M2. The second gate 125 is separated from the body region 112B of transistor M2 by a gate oxide 126. In one exemplary embodiment, the gate oxide layer 126 has a thickness less than 100 angstroms. Also in an exemplary embodiment, the body regions, 112A and 112B, of transistors M1 and M2 have a respective doping concentration of $10^{18}$ atoms per cubic centimeter ($10^{18}/cm^3$). In one exemplary embodiment, a second input 10 is coupled to the second gate 125 of the second transistor M2. In an exemplary embodiment of the differential amplifier 100, the threshold voltage (VT) for the first and second transistors, M1 and M2, is less thin 0.1 volts. In one exemplary embodiment, the differential amplifier 100 of the present invention provides a unity voltage gain frequency output having frequencies in the gigahertz (GHz) range.

The common mode feedback circuit 120 further includes a second inverting/amplifying circuit and a third inverting/amplifying circuit, 130 and 132 respectively. The second inverting/amplifying circuit 130, or second amplifying circuit 130, includes a fifth transistor M5 and sixth transistor M6. Each transistor, M5 and M6, includes a gate, 134 and 136 respectively, coupled to an output, Y or Y', of the differential amplifier 100. Each transistor, M5 and M6, includes a drain region, 138A and 138B respectively, coupled to a first common node 98. A source region, 140A and 140B, couples to a second common node 97. The second amplifying circuit 130 includes a seventh transistor M7 coupled at a drain region 150 to the first common node 98.

The third amplifying circuit 132 includes the output 99 from the common mode feedback circuit 120. The output 99 is coupled between a drain region 162A for an eighth transistor M8 and the drain region 162B of a ninth transistor M9. A source region 164A of the eighth transistor M8 is coupled to the second common node 97 of the second amplifying circuit 120. A gate 166B for the ninth transistor M9 is coupled to the first common node 98 of the second amplifying circuit 130. Additionally, as illustrated in FIG. 1A, transistor M7 includes a gate 152 to which a bias can be applied. In one embodiment, a body region 153 for transistor M7 similarly has a bias applied thereto. In an exemplary embodiment, transistors M5 and M6 are P-channel metal oxide semiconductors (PMOS) transistors and transistor M7 of the second amplifying circuit 130 is n-channel metal oxide semiconductor (NMOS) transistor. It should be noted that in MOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operation in an equivalent manner. In this embodiment, the body regions, 139A and 139B, of transistors M5 and M6 have an independent bias applied thereto. Transistor M8 includes a gate 166A with a bias applied thereto and, in one embodiment, transistor M8 has an independent bias applied to a body region 165 for the transistor. Transistor M9 includes has a body region 167 to which, in one embodiment, a independent bias is applied. The independent bias applied to the above stated transistors serve to reduce the threshold voltage (VT) in those respective transistors. The independent bias to the above stated body regions may be either fixed or variable.

The differential amplifier of the present invention includes having the pair of load devices, M3 and M4, and the first amplifying circuit 110 stacked as circuit layers, one on top of the other, on a first portion of a semiconductor substrate. The common mode feedback circuit 120, however, is located on a second portion of the substrate. Hence, the differential amplifier circuit 100 of the present invention requires only two devices to be stacked one atop another, which is the absolute minimum requirement. In contrast, the conventional differential amplifier circuit would requires three devices stacked one on top of another. In one embodiment, the common mode feedback circuit is coupled to a separate power supply.

Figure 1B:
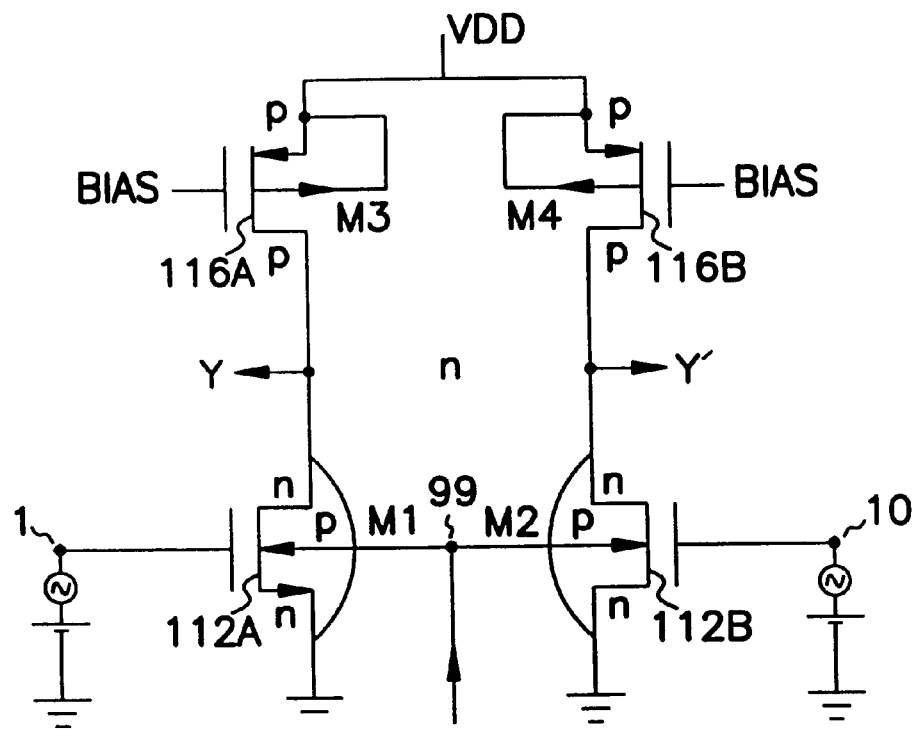
FIG. 1B is a schematic diagram illustrating an alternative embodiment of a differential amplifier according to the teachings of the present invention.

FIG. 1B provides a schematic diagram illustrating a portion of an embodiment of a first amplifying circuit 110 of the differential amplifier according to the teachings of the present invention. FIG. 1B illustrates an embodiment in which transistors M1 and M2 are N-channel metal oxide semiconductor (NMOS) transistors, In the embodiment of FIG. 1B, transistors M1 and M2 are formed with n-type substrates using a single powell CMOS process. The body regions, 112A and 112B, or p-wells, for the NMOS transistors, M1 and M2, are driven, or biased, by the output 99 from a common mode feedback circuit Also, as shown in the embodiment of FIG. 1B, the pair of load devices M3 and M4 are P-channel metal oxide semiconductor (PMOS) transistors. In this embodiment, the PMOS transistors, M3 and M4, have a low voltage threshold VT magnitude provided by an independently fixed bias to the body regions, 116A and 116B respectively.

Figure 1C:
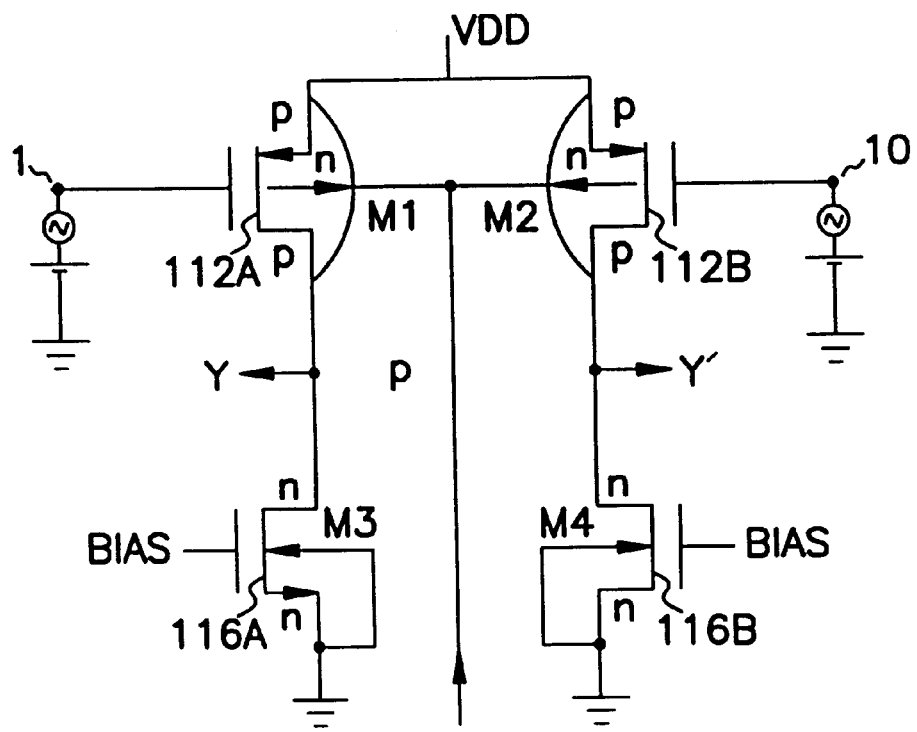
FIG. 1C is a schematic diagram illustrating an embodiment of the first amplifying circuit portion of a differential amplifier according to the teachings of the present invention.

Alternatively, FIG. 1C is a schematic diagram illustrating a portion of another embodiment of a first amplifying circuit of the differential amplifier according to the teachings of the present invention. In FIG. 1C the differential amplifier is turned upside down and the inputs, 1 and 10 respectively, are used to drive P-channel metal oxide semiconductor (PMOS) transistors, M1 and M2. In the embodiment of FIG. 1C, transistors M1 and M2 are formed with p-type substrates using a single n-well CMOS process. The body regions, 112A and 112B, or n-wells, for the PMOS transistors, M1 and M2, are driven, or biased, by the output from a common mode feedback circuit. Also, as shown in the embodiment of FIG. 1C, the pair of load devices, M3 and M4, are N-channel metal oxide semiconductor (NMOS) transistors. In this embodiment, the NMOS transistors, M3 and M4, have a low voltage threshold VT magnitude provided by an independently fixed bias to the body regions, 116A and 116B respectively.

Figure 1D:
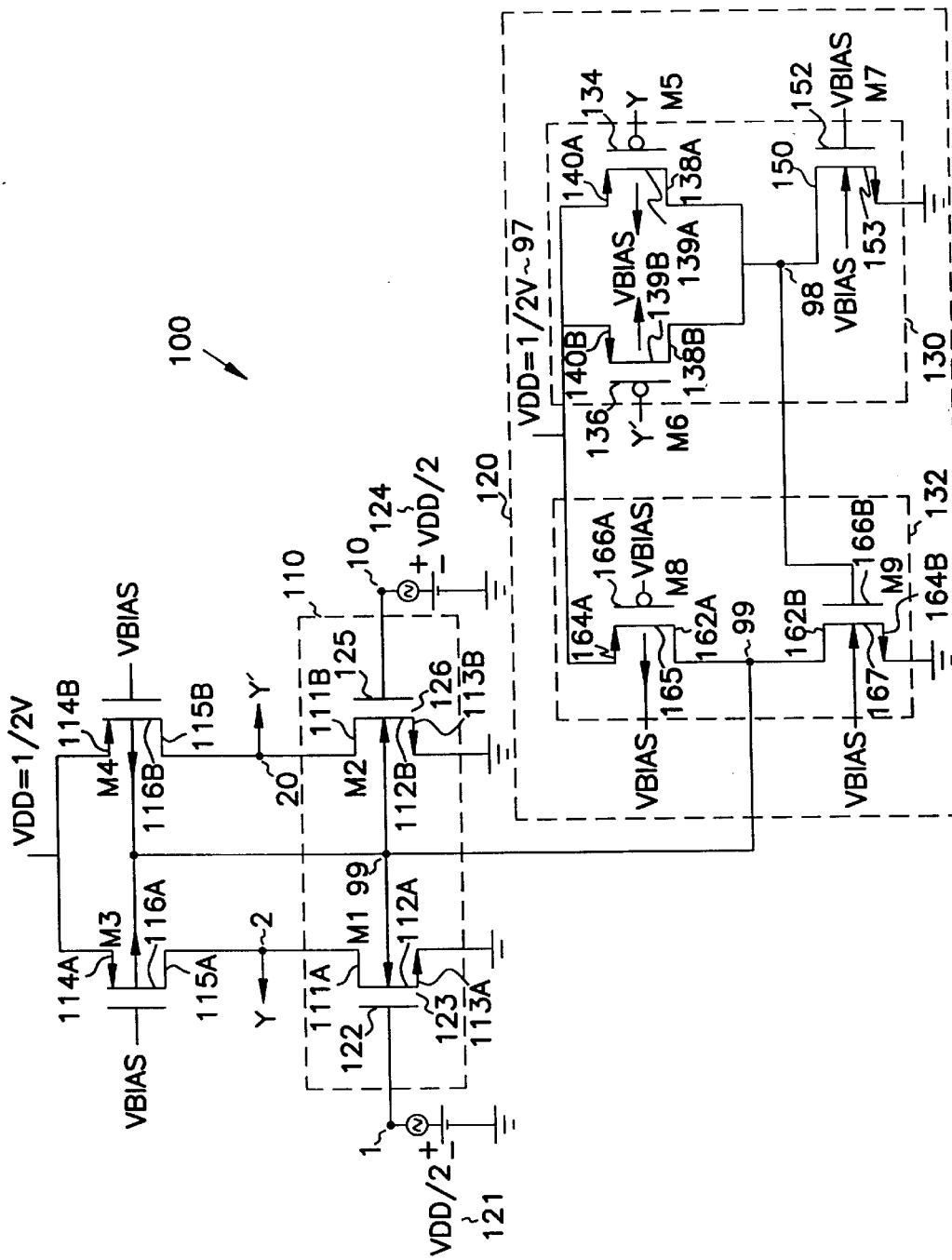
FIG. 1D is a schematic diagram illustrating another embodiment of the first amplifying circuit portion of a differential amplifier according to the teachings of the present invention.

An alternative embodiment of the present inventions illustrated in FIG. 1D. In FIG. 1D, the common mode feedback circuit 120 includes an output 99 which couples a bias to the body regions, 112A and 112B, of the first and second transistors, M1 and M2, and couples the same bias to the body regions, 116A and 116B, of the third and fourth transistors, M3 and M4. In this embodiment, the bias to the body regions of transistors M3 and M4 improves the operation of transistors M3 and M4 by lowering the value and stabilizing the variation of the threshold voltages (VT) for these transistors. In this embodiment, the differential amplifier 100 is formed using a triple-well CMOS technology, or alternatively, the differential amplifier 100 is formed on a silicon-on-insulator (SOI) layer so that the body potentials of both types of transistors are varied. The differential amplifier 100, in either the embodiment of FIG. 1A or the embodiment of FIG. 1D, achieve the high gain and frequency response characteristics.

In the embodiment of FIG. 1A, transistors, M1, M2, M3 and M4 constitute a differential amplifier. M1 and M2, however, are not a source coupled pair of amplifying transistors as in the conventional differential amplifier. Instead, common mode feedback is provided by the common mode feedback circuit 120 which drives the body regions, 112 and 112B, of transistors M1 and M2. The common mode feedback circuit 120 has some gain (AFB) which is the product of the gains of the two individual amplifier circuits, e.g., the second amplifying circuit 130 and the third amplifying circuit 132 restively. In the common mode feedback circuit 120, the second amplifying circuit 130 consists of transistors M5/M6 and M7. The third amplifying circuit 132 consists of transistors M8 and M9.

Figure 2A:
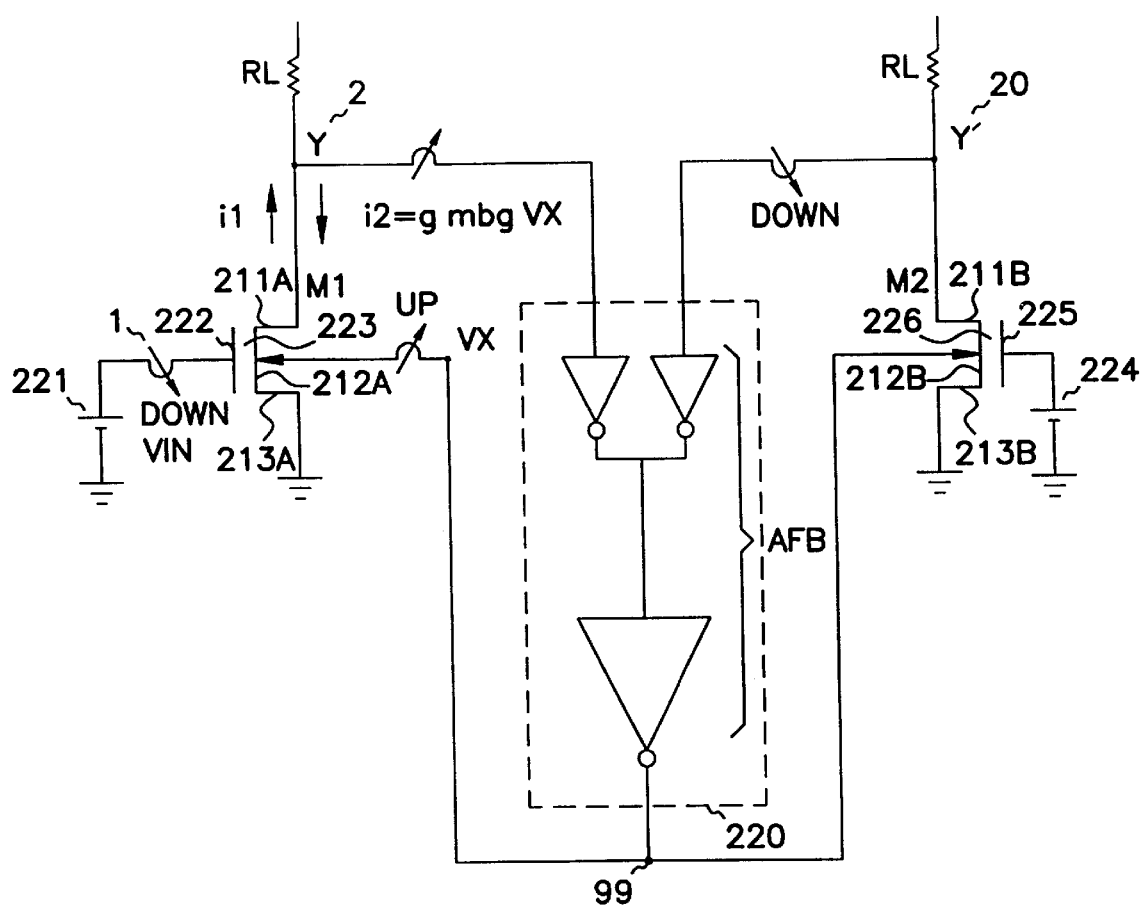
FIG. 2A is a schematic diagram useful in illustrating the differential gain operation for the differential amplifier according to the present invention.

FIG. 2A is a schematic representation of an equivalent circuit diagram used only to illustrate the operation for the differential amplifier according to the present invention. In particular, FIG. 2A is used to illustrate differential gain of the present invention when a single input is driven. In operation, if M1 is driven with a signal, thus producing voltage VY at the drain region 211A of M1, the effect of the feedback circuit to produce a voltage VY' at the drain region 211B of transistor M2. At low frequencies the voltage VY' is nearly the same magnitude as VY but is 180° out of phase. This feature or aspect of the present invention can be best understood by comparing the following equations and with FIG. 2A.

The bias potential to the body region 212A of transistor M1 is given by Equation 1, $$Vx=AFB(VY+VY') \quad (1)$$

where the gain from the common mode feedback circuit 220 is AFB=[(gmRL)(gmRL)]/2. The potential at the Y' output 20, when M2 is not driven by a signal is:

$$VY'=-gmbgRLVx.$$

The bias Vx then provided by the output 99 of the common mode feedback circuit to the body regions of transistors, M1 and M2, is:

$$Vx=-VY'/gmbgRL.$$

Thus, using Equation (1):

$$VY'/gmbgRL=AFB(VY)+AFB(VY').$$

Hence, $$VY'(1+AFB(gmbgRL))=-AFB(gmbgRL)VY,$$

and at low frequencies VY'≅−VY. Alternatively stated, VY and VY' are 180° out of phase. As shown in FIG. 2A, this results as a consequence of the closed loops in feedback circuits consisting of the second and third amplifying/inverting circuits, 130 and 132 respectively of the common mode feedback circuit 120, and the back gate transconductances of M1 and M2.

For simplicity, and by way of illustration, the transistors have been assumed to be described by similar parameters and in particular similar transconductance parameters in the device models. In practice, of course, the device sizes are ratioed and the PMOS transistors fabricated with a larger width to length (W/L) ratio. All transistors in the circuit then have the same transconductance (gm), backgate transconductance (gmbg), and drain conductance (gdn or gdp), except transistors M5 and M6 which the approximately half the size of M1 and M2 to obtain the correct dc levels. Here, backgate transconductance (gmbg) is intended to reflect the transconductance of a component transistor caused by the bias to the body region of the component transistor whether that bias is supplied from the common mode feedback circuit or an independent bias source which, either fixed or variable.

The bias applied to the body regions of transistors M1 and M2 serves to reduce the threshold voltage (VT) when the transistors M1 and M2 are forward biased at VDD/2. In one embodiment, the transistors M1 and M2 are designed so that in operation VT is less hand 0.1 V. In one exemplary embodiment, transistors M1 and M2 are designed so that in operation VT is near zero. The voltage, VX, must be small since the gains provided by the bias to the body regions of the transistors are high Vx will in fact be small when VY' is almost the same magnitude as VY but 180° out of phase, which occurs at low frequencies. In this application the phrase "low frequencies" is intended to represent frequencies in the megahertz (MHZ) range and below. The differential gain of the circuit is:

$$ADM=(VY'-VY)/VIN=gm\ RL$$

where gm is the transconductance of M1 and/or M2 and RL is the effective load resistance seen by either M1 or N2. At low frequencies, e.g., frequencies in the megahertz (MHZ) range and below, RL=1/(gdn+gdp), where gdn and gdp are the drain conductances of the NMOS and PMOS transistors.

In one embodiment, the gate oxide layers, 226A and 226B, are provided to have a thickness of less than approximately 100 angstroms. In one exemplary embodiment, in which the gate oxide layers, 226A and 226B, have a thickness of approximately 66 angstroms, and where the body regions, 212A and 212B, of transistors M1 and M2 have a respective doping concentration of approximately $10^{18}$ atoms per cubic centimeter ($10^{18}/cm^3$), the value of gm is approximately 520 uS. In this embodiment, the values for gdn=gdp are 1.68 uS to yield a differential gain of approximately 160. According to the relationship provided above, e.g., VY'≅−VY, the single ended output provides a gain of approximately 80, or half that of the differential output the results above have been verified to SPICE simulations where, for example, in a 1μ CMOS technology, a differential gain of about 160 is obtained with a bandwidth of 1 MHZ.

Figure 2B:
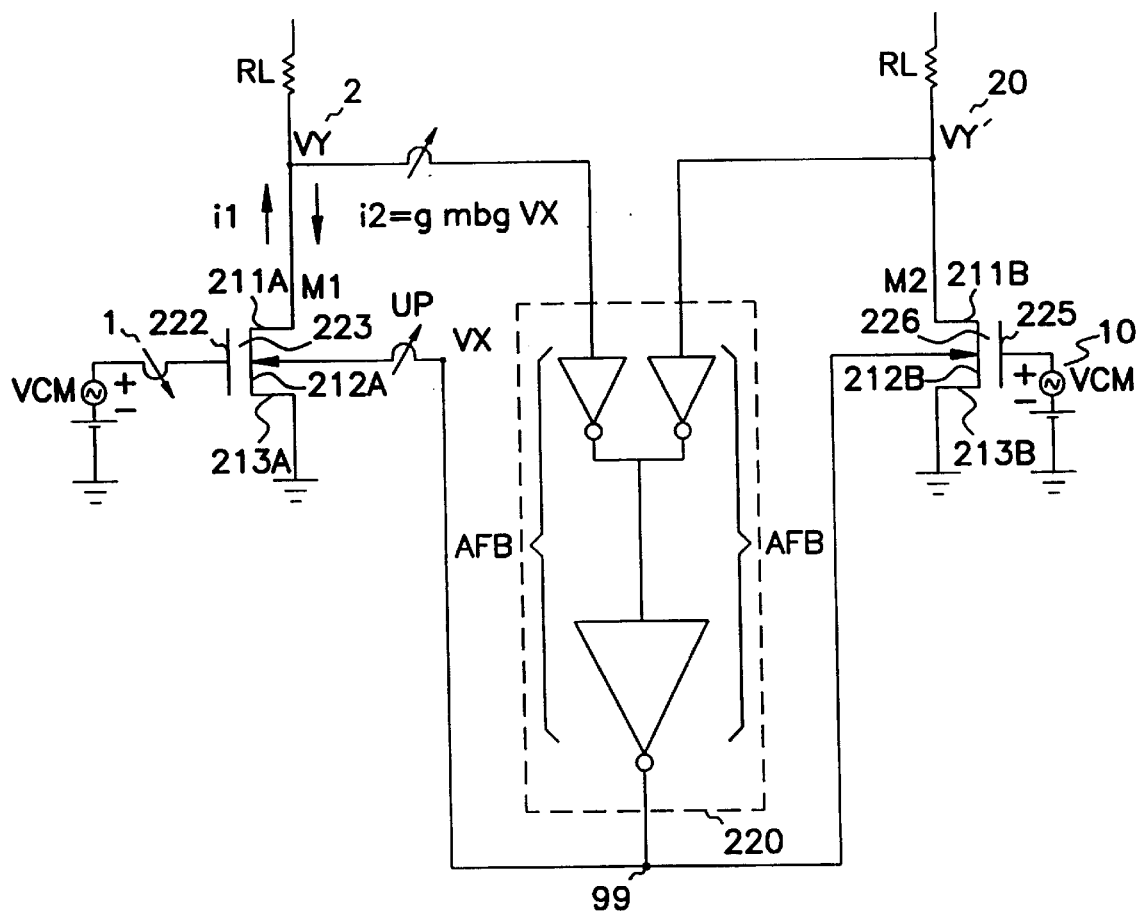
FIG. 2B is a schematic diagram useful in illustrating the common mode gain for the differential amplifier according to the present invention.

Another consideration in differential and/or operational amplifiers is the common mode gain (ACM) and the common mode rejection ratio (CMRR). FIG. 2B is a schematic representation of an equivalent circuit diagram used to only illustrate the operation for the differential amplifier according to the present invention. In particular, FIG. 2B is useful in illustrating the common mode gain of the present invention. If both inputs, 1 and 10, are driven with a common mode signal, VCM, then the circuit is symmetrical which simplifies the analysis and both voltages, VY and VY', are the same.

Once again, the bias potential to the body region 212A of transistor M1 is given be Equation 1, $$Vx=AFB(VY+VY') \quad (1)$$

where the gain from the feedback circuit is AFB=[(gmRL)(gmRL)]/2. Since VY' is approximately equal in magnitude, $$Vx=2 \times [(gmRL)(gmRL)/2]VY.$$

The current, $i_1$, at the Y output 2, which is attributed to the bias VCM applied to the gate 222, is:

$$i_1=gm(VCM)$$

and the current, $i_2$, attributed to the body bias applied to the body region 212A at the Y output 2 is;

$$i_2 =gmbg(Vx).$$

Therefore the output potential, VY, at Y output 2 is:

$$VY=(i_1 -i_2)RL,$$

and $$VY=(gmVCM-gmbgVx)RL.$$

Using the value of Vx provided above, $$VY=(gmVCM-gmbg (gmRL)^2VY)RL$$

or, $$VY(1+gmbg(RL) (gmRL)^2)=gmVCM(RL).$$

The common mode gain (ACM) is defined by:

$$ACM=VY/VCM.$$

From above, $$VY/VCM=gmRL/[1+(gmbgRL)(gmRL)^2].$$

For low frequency values, $$ACM=VY/VCM \cong 1/gmbgRL(gmRL).$$

Here again, gm is the transconductance of M1 and/or M2 and RL is the effective load resistance seen by either M1 and M2. Again, at low frequencies, e.g., frequencies in the megahertz (MZ) range and below, RL=1/(gdn+gdp), where gdn and gdp Am the drain conductances of tho NMOS and PMOS transistors.

In one embodiment, the gate oxide layers, 226A and 226B, are provided to have a thickness of less that approximately 100 angstroms. In one exemplary embodiment, when the gate oxide layers, 226A and 226B, have a thickness of approximately 66 angstroms, and where the body regions, 212A and 212B, of transistors M1 and M2 have a respective doping concentration of $10^{18}$ atoms per cubic centimeter ($10^{18}$/cmd$^3$), the value of gm is approximately 520 uS. In this embodiment, the values for gdn=gdp are approximately 1.68 uS. The net result is that the common mode signal at the output of the first amplifier is small and is reduced by the gain of the feedback circuit In this exemplary embodiment, ACM works out to be a value of about $3\times10^{-5}$. This value is confirmed by the SPICE simulations which show a common mode gain of about 0.00003, a very small number. The common mode, rejection ratio is then works out to be:

$$ADM/ACM=5\times10^{+6} \text{ or about } 134 \text{ dB}$$

according to this exemplary embodiment.

Figure 3:
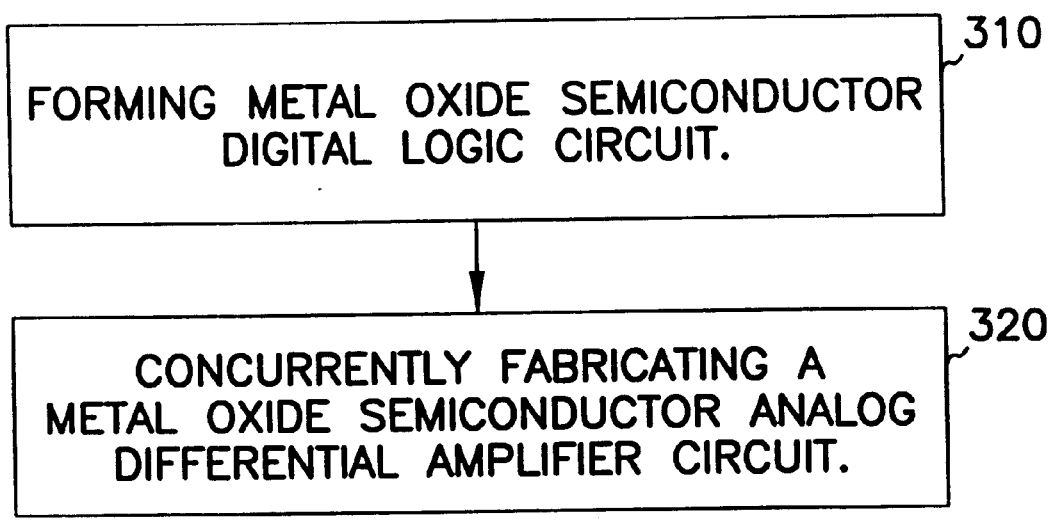
FIG. 3 illustrates, in flow diagram form, a methodical aspect for forming a signal processing circuit, according to the teachings of the present invention.

FIG. 3 illustrates, in flow diagram form, a methodical aspect for forming a signal processing circuit according to the teachings of the present invention. As illustrated by FIG. 3 a metal oxide semiconductor digital logic circuit 310 is formed concurrently with fabricating a metal oxide semiconductor analog differential amplifier circuit 320. In one exemplary embodiment, forming the metal oxide semiconductor digital logic circuit concurrently with the metal oxide semiconductor analog differential amplifier circuit includes forming the digital logic circuit and the differential amplifier circuit on a single semiconducting wafer. In an exemplary embodiment, fabricating the metal oxide semiconductor analog differential amplifier circuit includes fabricating a first amplifying circuit which has a first transistor and a second transistor of a first conductivity type. Each transistor has a source region, a drain region and a body region. Fabricating the differential amplifier circuit further includes fabricating a pair of load devices such that each load device couples to a drain region of a respective one of the first transistor and the second transistor. A first and second output to the differential amplifier circuit is coupled between one of the pair of the load devices and one of the drain regions for either the first or the second transistor, respectively. A common mode feedback circuit is fabricated such that the common mode feedback circuit includes an output which couples the bias to the body regions of the first and second transistors. In this exemplary embodiment, fabricating the first amplifying circuit and the pair of load devices includes fabricating the first amplifying circuit and the pair of load devices as circuit layers, one on top of the other, on a first portion of a semiconducting substrate. Fabricating the common mode feedback circut includes fabricating the common mode feedback circuit on a second portion of the substrate. In one exemplary embodiment, fabricating the differential amplifier circuit includes single-well CMOS technology. In an alternative embodient, fabricating the differential amplifier includes using triple-well CMOS technology.

Figure 4:
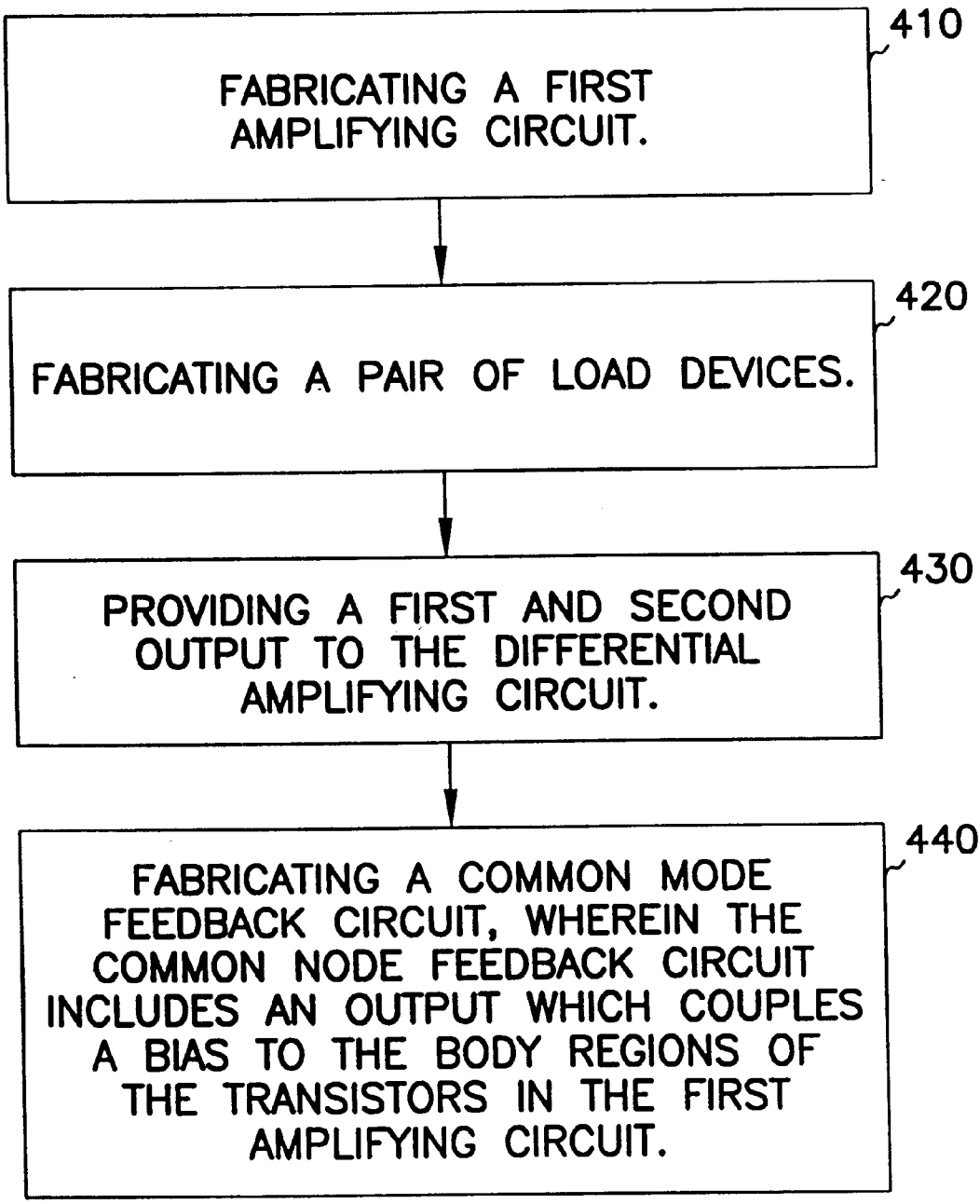
FIG. 4 illustrates, in flow diagram form, another methodical aspect for forming a differential amplifier circuit, according to the teachings of the present invention.

FIG. 4 illustrates, in flow diagram form, a methodical aspect for forming an analog differential amplifying circuit, according to the teachings of the present invention. As illustrated in FIG. 4, the method includes fabricating a first amplifying circuit 410 having a first transistor and second transistor of a first conductivity type. Each transistor has a source region, a drain region and a body region. A pair load devices are fabricated 420 such that each load device couples to a drain region of a respective one of the first transistor and the second transistor. A first and second output are coupled to the analog differential amplifying circuit 430. Coupling the first and the second output to the differential amplifier circuit includes coupling each output between one of the pair of the load devices and one of the drain regions for either the first or the second transistor, respectively. A common mode feedback circuit is fabricated 440 such that the common mode feedback circuit includes an output which couples a bias to the body regions of the first and second transistors. In one exemplary embodiment, fabricating the analog differential amplifier circuit includes concurrently fabricating a metal oxide semiconductor digital logic circuit on a single semiconductor substrate. In one exemplary embodiment, fabricating the differential amplifier circuit includes using single-well CMOS technology. In an alternative embodiment, fabricating the analog differential amplifying circuit includes using tiple-well CMOS technology. In one exemplary embodiment, fabricating a pair of load devices includes fabricating a third and a fourth transistor. In this exemplary embodiment, fabricating the first, second, third and fourth transistors includes fabricating the transistors in a size ratioed manner such that the transistors have equivalent parameters of transconductance (gm), backgate-transconductance (gmbg) and drain conductance (gdn or gdp). One of ordinary skill in the art will understand upon reading this disclosure the methods in which to size ratio transistors including appropriate doping concentrations in order to achieve these equivalent parameters of transconductance. In one exemplary embodiment, fabricating a common mode feedback circuit includes forming the common mode feedback circuit such that the output of the common mode feedback circuit further couples a bias to the body regions of the third and fourth transistors. In an exemplary embodiment, providing a first and second output to the differential amplifier circuit further includes coupling the first output to a first input for the common mode feedback circuit and coupling the second output to a second input for the common mode feedback circuit. In one exemplary embodiment, fabricating the differential amplifying circuit includes concurrently fabricating a metal oxide semiconductor digital logic circuit on a single semiconductor substrate. Fabricating the first amplifying circuit and fabricating the pair of load devices includes fabricating the first amplifying circuit and the pair of load devices as circuit layers, one on top of the other, on a first portion of a semiconductins substrate. Fabricating the common mode feedback circuit includes fabricating the common mode feedback circuit on a second portion of the substrate. In one exemplary embodiment, fabricating a first amplifying circuit having a first transistor and a second transistor includes fabricating the body region of the first and second transistors with a doping concentration of $10^{18}$ atoms per $cm^3$.

Figure 5:
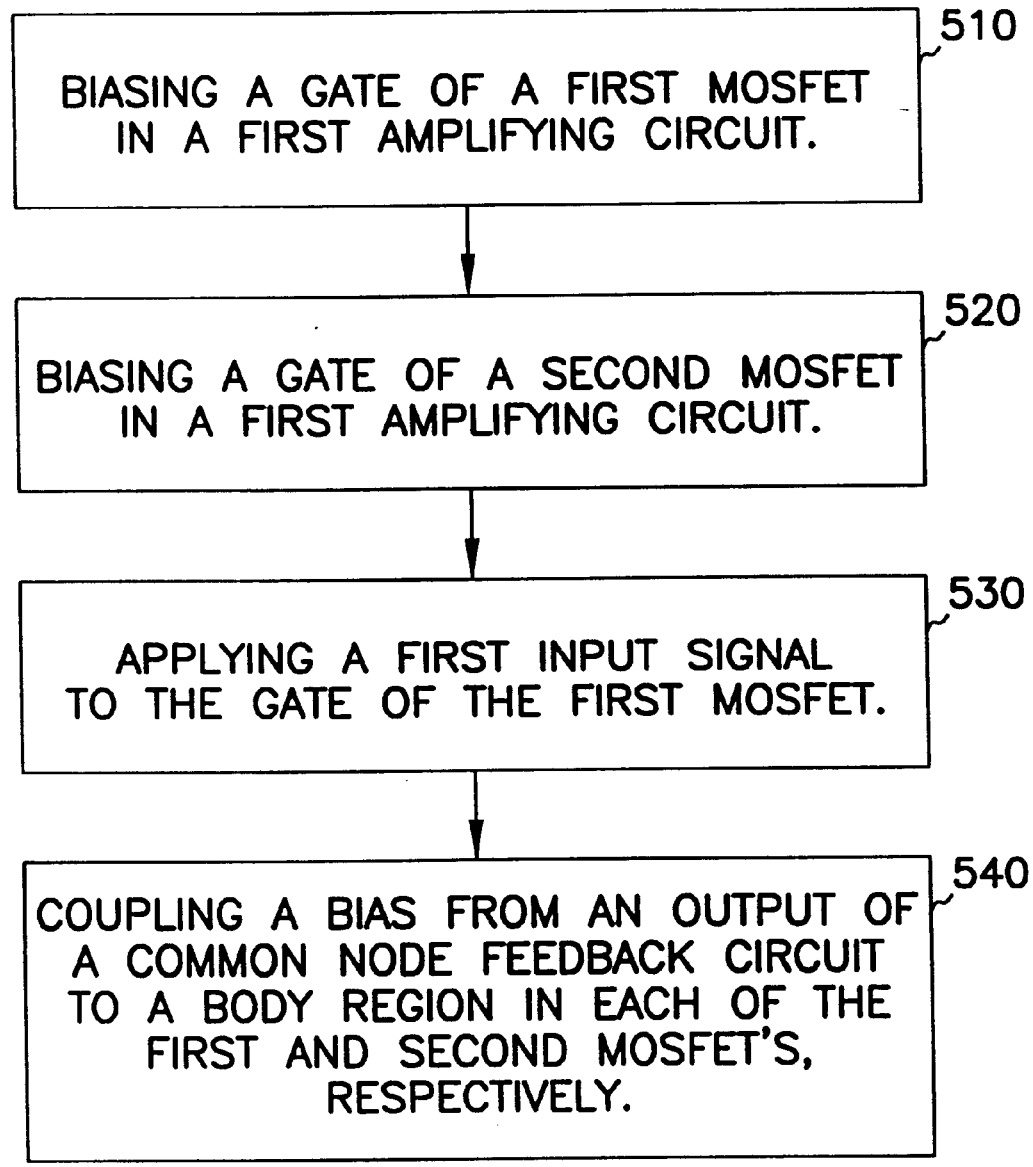
FIG. 5 illustrates, in flow diagram form, a methodical embodiment for operating the present invention.

FIG. 5 illustates, in flow diagram form, a methodical embodiment for operating the present invention. As FIG. 5 illustrates, the method includes biasing a gate of a first MOSFET in a first amplifying circuit 510. A gate of a second MOSFET in the first amplifying circuit is biased 520. A first input signal is applied to the gate of the first MOSFET 530. A bias of an output from a common mode feedback circuit is coupled to a body region in each of the first and second MOSFETs, respectively 540. In one exemplary embodiment, the method further includes applying the second input signal to the gate of the second MOSFET.

Figure 6:
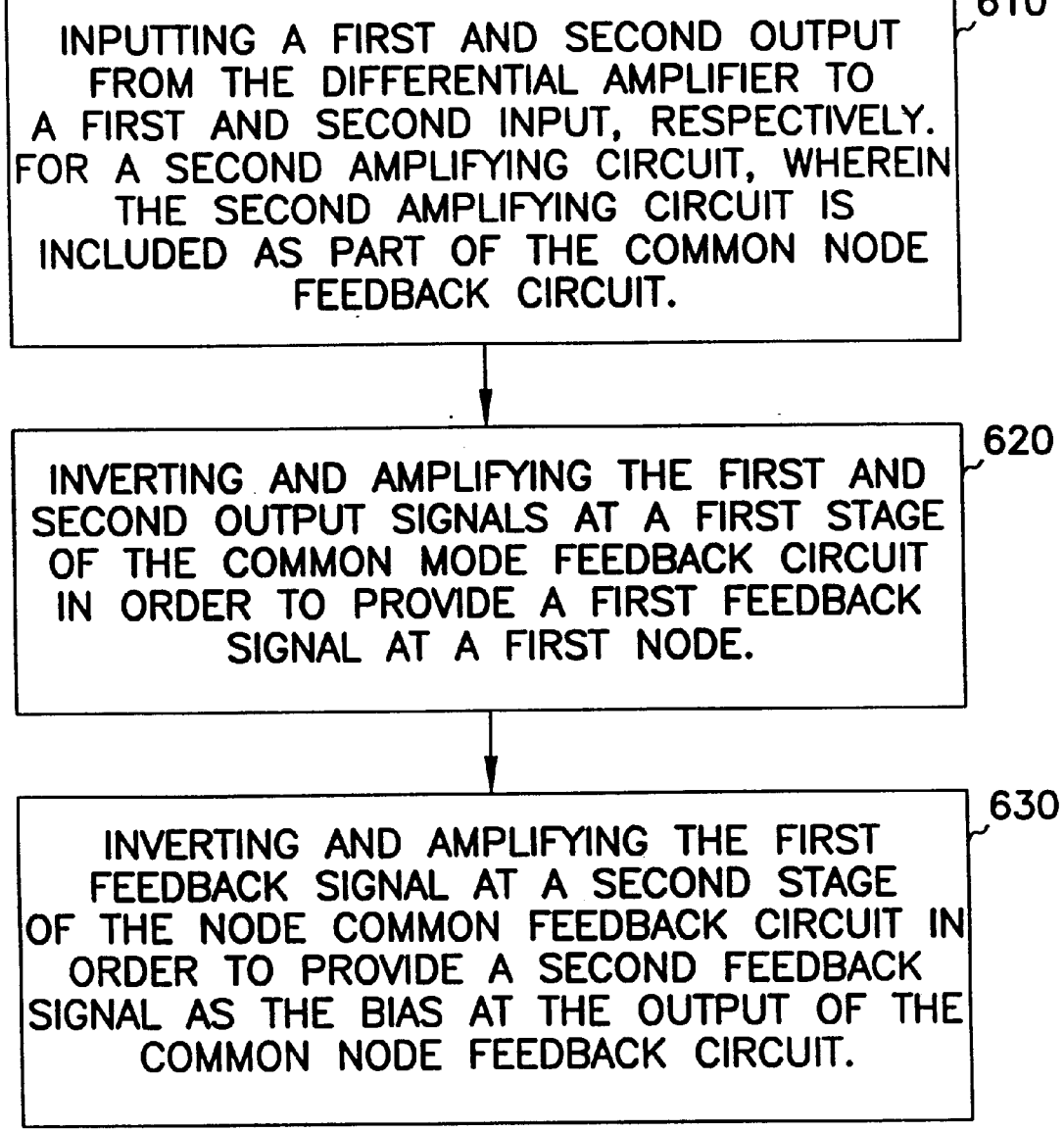
FIG. 6 illustrates, in flow diagram form, another more detailed methodical embodiment for operating the present invention.

FIG. 6 illustrates, in flow diagram form, a more detailed methodical embodiment for coupling a bias from an output of a common mode feedback circuit to the body regions of each MOSFET in a first amplifying circuit As FIG. 6 illustrates, the method includes inputting a first and a second output from the differential amplifier to a first and a second input, respectively for the common mode feedback circuit 610. The first and second output signals are inverted and amplified at a first stage of the common mode feedback circuit in order to provide a first feedback signal at a first node 620. Further, in this exemplary embodiment, the first feedback signal is inverted and amplified at a second stage of the common mode feedback circuit in order to provide a second feedback signal as the bias at the output of the common mode feedback circuit 630.

Figure 7:
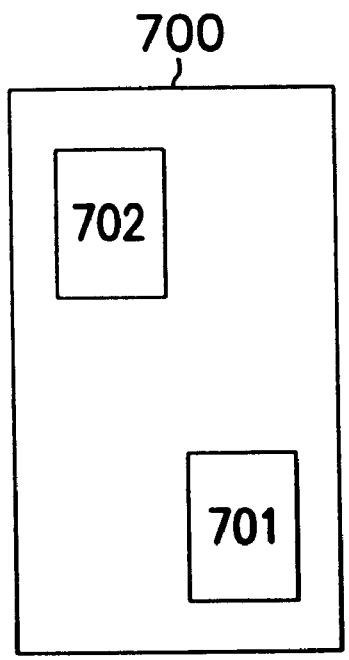
FIG. 7 is a block diagram illustrating a single integrated circuit according to an embodiment of the present invention.

FIG. 7 is a clock diagram, illustrating a single integrated circuit 700 according to an embodiment of the present invention. FIG. 7 illustrates that the single integrated circuit 700 includes a digital logic circmuit 701 and an analog circuit 702. The analog circuit 702 includes a first amplifying circuit which has a first transistor and a second transistor of a first conductivity type. Each transistor has a source region, a drain region and a body region. A pair of load devices coupled to a drain region of a respective one of the first transistor and the second transistor. A first and a second output ur coupled between one of the pair of load devices in one of the drain regions for either the first transistor or the second transistor, respectively. A common mode feedback circuit is included which has an output coupling a bias to the body regions of the first and the second transistors. In one exemplary embodiment, the digital logic circuit 701 and the analog circuit 702 are fabricated using one micron ($1\mu$) CMOS processing techniques. In one exemplary embodiment, the fist amplifying circuit and the pair of load devices are stacked as circuit layers, one on top of the other, on a first portion of the semiconducting substrate and the common mode feedback circuit is located on a second portion of the substrate. In one exemplary embodiment, the analog circuit 702 includes a differential gain which is greater than 150. In this embodiment, the analog circuit 702 has a common mode rejection ration (ADM/ACM) which is greater than 130 decibals (dB). The analog circuit 702 is coupled to a power supply voltage of less than 1.0 volts. The first and second transistors in the first amplifying circuit each have a thresold voltage (VT) which is less than 0.1 volts. The analog circuit 702 provides a unity voltage gain frequency output having frequencies in the gigahertz (GHz) range.

Figure 8:
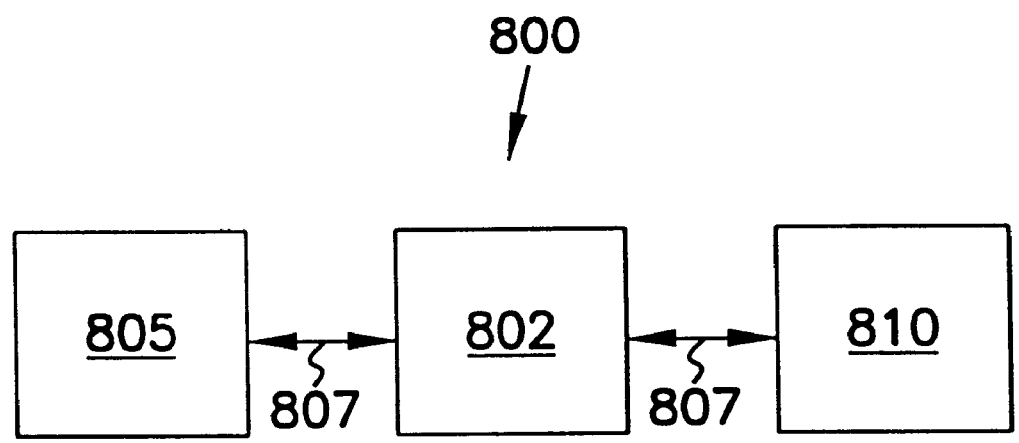
FIG. 8 is a block diagram illustrating an electronic system according to an embodiment of the present invention.

FIG. 8 is a block diagram illustrating an electronic system 800 according to the embodiment of the present invention. As illustrated by FIG. 8, the electronic system 800 includes a logic circuit 805, a memory circuit 810, and a differential amplifier circuit 802. The differential amplifier circuit 802 is coupled to the logic circuit 805 and memory circuit 810 by a number of input/output (IO) lines 807 adapted transmitting information between the logo circuit 805, the memory circuit 810 and the differential amplifier circuit 802. The differential amplifier circuit 802 includes a first amplifying circuit which includes a first transistor and a second transistor of a first conductivity type. Each transistor has a source region, a drain region and a body region. A pair of load devices coupled to a drain region of a respective one of the first transistor and the second transistor. A first and a second output each coupled between one of the pair of load devices and one of the drain regions for either the first transistor or the second transistor, respectively. The common mode feedback circuit is included which has an output which couples a bias to the body regions of the first and the second transistors. In one exemplary embodiment, the first amplifying circuit and the pair of load devices are stacked as circuit layers, one on top of the other, on a first portion of a semiconducting substrate. The common mode feedback circuit is located a a second portion of the substrate. In one exemplary embodiment, the differential amplifier circuit includes a common mode rejection ratio (ADM/ACM) of greater than 130 decibals (dB). In this exemplary embodiment, the differential amplifier circuit includes a differential gain (ADM) of greater than 150. The differential amplifier circuit is coupled to a power supply voltage of less than 1.0 volts. In one exemplary embodiment, the threshold voltage (VT) for the first and the second transistors is less than 0.1 volts. In this exemplary embodiment, the differential amplifier circuit provides a unity voltage gain frequency output having frequencies in the gigahertz (GHz) range.

Conclusion

A structure and method for improving differential amplifier operation is provided. High performance, wide bandwidth or very fast CMOS amplifiers are possible using the new circuit topology of the present invention. The differential amplifier of the present invention employs a novel common mode feedback circuit to back bias the body regions of the amplifying transistors in the differential amplifier. The novel configuration is achieved entirely using CMOS fabrication techniques and delivers high performance in both amplifier gain (G) and frequency response (fT) characteristics using a 1 micron (1$\mu$) CMOS technology.

In one exemplary embodiment, the common mode feedback circuit is fabricated on a different portion of a semiconductor substrate apart from the amplifying transistors and load devices of the differential amplifier. Thus, the invention avoids stacking the three principle circuit components of the differential amplifier, three high, one on top of each other.

The inventive common mode feedback circuit reduces high and variable values for threshold voltages (VT) which plague the precision of transistor operation using 1 micron (1$\mu$) CMOS technology. The CMOS differential amplifier topology facilitates component transistor operation at low and stable threshold voltages at less than 0.1 V. Thus, the CMOS amplifier delivers high performance criteria at very low power supply voltages, e.g., less than 1.0V. At these low power supply voltages, unity voltage gain frequencies are achieved far in excess of 1 GHz Additionally, the CMOS differential amplifier topology of the present invention provides increased gain performance. The low threshold voltage (VT) values and low threshold voltage (VT) variance, facilitated by the novel common mode feedback circuit, yield significant differential gain (ADM) at low power supply voltages. The common mode signal of the present invention is reduced by the gain of the novel common mode feedback circuit (AFT), thus producing a low common mode gain (ACM) and a high common mode rejection ratio.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the bove description. The scope of the invention includes any other applications in which the above structure and fabrication methods are used. The scope of the invention should be determined with reference to the appended claims, along with the full scope of equivalents to which such claims are entitled.

What is claimed is:

1. A method for forming a signal processing circuit, comprising:

forming a metal oxide semiconductor digital logic circuit using CMOS technology; and concurrently fabricating a metal oxide semiconductor analog differential amplifier circuit using CMOS technology, wherein fabricating the analog differential amplifier circuit comprises:

fabricating a pair of amplifier circuits on a first portion of a substrate;

fabricating a pair of load devices on the first portion of the substrate, coupled to the pair of amplifier circuits; and fabricating a common mode feedback circuit on a second portion of the substrate, the common mode feedback circuit being coupled to the pair of amplifier circuits.

2. The method of claim 1, wherein fabricating a metal oxide semiconductor analog differential amplifier circuit includes fabricating a metal oxide semiconductor analog differential amplifier which operates with a circuit power supply voltage of less than 1.0 Volt.

3. A method for forming a signal processing circuit, comprising:

forming a metal oxide semiconductor digital logic circuit using CMOS technology; and concurrently fabricating a metal oxide semiconductor analog differential amplifier circuit using CMOS technology, wherein fabricating the analog differential amplifier circuit comprises:

fabricating a pair of amplifier circuits on a first portion of a substrate;

fabricating a pair of load devices on the first portion of the substrate, coupled to the pair of amplifier circuits, wherein the pair of amplifier circuits and the pair of load devices are stacked as circuit layers; and fabricating a common mode feedback circuit on a second portion of the substrate, the common mode feedback circuit being coupled to the pair of amplifier circuits.

4. The method of claim 3, wherein forming a metal oxide semiconductor digital logic circuit and concurrently fabricating a metal oxide semiconductor analog differential amplifier circuit includes forming the digital logic circuit and the analog differential amplifier circuit on a single semiconducting wafer.

5. The method of claim 3, wherein fabricating the differential amplifying circuit includes fabricating a differential amplifying circuit capable of operating at frequencies in the gigahertz (MHz) range.

6. The method of claim 3 wherein fabricating the analog differential amplifier circuit includes forming the analog differential amplifier circuit to provide a common mode gain (ACM) of less than $3 \times 10^{-5}$.

7. A method for forming a signal processing circuit, comprising:
   forming a metal oxide semiconductor digital logic circuit using CMOS technology;
   concurrently fabricating a metal oxide semiconductor analog differential amplifier circuit using CMOS technology, wherein fabricating the analog differential amplifier circuit comprises:
      fabricating a pair of amplifier circuits on a first portion of a substrate, the amplifier circuits including a pair of transistors with a pair of body regions;
      fabricating a pair of load devices on the first portion of the substrate, coupled to the pair of amplifier circuits;
      fabricating a common mode feedback circuit on a second portion of the substrate; and
      coupling the common mode feedback circuit to provide a bias to the body regions of the pair of amplifier circuits.

8. The method of claim 7, wherein fabricating a metal oxide semiconductor analog differential amplifier circuit includes fabricating a metal oxide semiconductor analog differential amplifier circuit using 1 micron ($1\mu$) CMOS processing techniques.

9. The method of claim 7, wherein fabricating a metal oxide semiconductor analog differential amplifier circuit includes fabricating a metal oxide semiconductor analog differential amplifier circuit having a differential gain which is greater than 150.

10. The method of claim 7 wherein fabricating a metal oxide semiconductor analog differential amplifier circuit includes fabricating a metal oxide semiconductor analog differential amplifier circuit having a common mode rejection ratio (ADM/ACM) which is greater than 130 decibels (dB).

11. The method of claim 7, wherein fabricating a metal oxide semiconductor analog differential amplifier circuit includes fabricating a metal oxide semiconductor analog differential amplifier which operates with a circuit power supply voltage of less than 1.0 Volt.

12. A method for forming an electronic system, comprising:
   forming a memory circuit;
   forming a metal oxide semiconductor digital logic circuit coupled to the memory circuit using CMOS technology;
   concurrently fabricating a metal oxide semiconductor analog differential amplifier circuit coupled to the digital logic circuit and the memory circuit using CMOS technology, wherein fabricating the analog differential amplifier circuit comprises:
      fabricating a pair of amplifier circuits on a first portion of a substrate;
      fabricating a pair of load devices on the first portion of the substrate, coupled to the pair of amplifier circuits; and
      fabricating a common mode feedback circuit on a second portion of the substrate, the common mode feedback circuit being coupled to the pair of amplifier circuits.

13. The method of claim 12, wherein fabricating a metal oxide semiconductor analog differential amplifier circuit includes fabricating a metal oxide semiconductor analog differential amplifier which operates with a circuit power supply voltage of less than 1.0 Volt.

14. A method for forming an electronic system, comprising:
   forming a memory circuit;
   forming a signal processing circuit coupled to the memory circuit, comprising:
      forming a metal oxide semiconductor digital logic circuit using CMOS technology; and
      concurrently fabricating a metal oxide semiconductor analog differential amplifier circuit using CMOS technology, wherein fabricating the analog differential amplifier circuit comprises:
         fabricating a pair of amplifier circuits on a first portion of a substrate;
         fabricating a pair of load devices on the first portion of the substrate, coupled to the pair of amplifier circuits; and
         fabricating a common mode feedback circuit on a second portion of the substrate, the common mode feedback circuit being coupled to the pair of amplifier circuits.

15. The method of claim 14, wherein forming a metal oxide semiconductor digital logic circuit and concurrently fabricating a metal oxide semiconductor analog differential amplifier circuit includes forming the digital logic circuit and the analog differential amplifier circuit on a single semiconducting wafer.

16. The method of claim 14, wherein fabricating the differential amplifying circuit includes fabricating a differential amplifying circuit capable of operating at frequencies in the gigahertz (GHz) range.

17. The method of claim 14, wherein fabricating the analog differential amplifier circuit includes forming the analog differential amplifier circuit to provide a common mode gain (ACM) of less than $3 \times 10^{-5}$.

18. A method for forming an electronic system, comprising:
   forming a memory circuit;
   forming a metal oxide semiconductor digital logic circuit coupled to the memory circuit using CMOS technology;
   concurrently fabricating a metal oxide semiconductor analog differential amplifier circuit coupled to the digital logic circuit and the memory circuit using CMOS technology, wherein fabricating the analog differential amplifier circuit comprises:
      fabricating a pair of amplifier circuits on a first portion of a substrate, the amplifier circuits including a pair of transistors with a pair of body regions;
      fabricating a pair of load devices on the first portion of the substrate, coupled to the pair of amplifier circuits;

fabricating a common mode feedback circuit on a second portion of the substrate; and coupling the common mode feedback circuit to provide a bias to the body regions of the pair of amplifier circuits.

19. The method of claim 18, wherein fabricating a metal oxide semiconductor analog differential amplifier circuit includes fabricating a metal oxide semiconductor analog differential amplifier circuit using 1 micron (1µ) CMOS processing techniques.

20. The method of claim 18, wherein fabricating a metal oxide semiconductor analog differential amplifier circuit includes fabricating a metal oxide semiconductor analog differential amplifier circuit having a differential gain which is greater than 150.

21. The method of claim 18, wherein fabricating a metal oxide semiconductor analog differential amplifier circuit includes fabricating a metal oxide semiconductor analog differential amplifier circuit having a common mode rejection ratio (ADM/ACM) which is greater than 130 decibels (dB).

22. The method of claim 18, wherein fabricating a metal oxide semiconductor analog differential amplifier circuit includes fabricating a metal oxide semiconductor analog differential amplifier which operates with a circuit power supply voltage of less than 1.0 Volt.

23. A method for forming a signal processing circuit, comprising:

forming a metal oxide semiconductor digital logic circuit; and concurrently fabricating a metal oxide semiconductor analog differential amplifier circuit, wherein fabricating the metal oxide semiconductor analog differential amplifier circuit further includes:

fabricating a first amplifying circuit on a first portion of a substrate, using CMOS technology, the first amplifying circuit having a first transistor and a second transistor of a first conductivity type, wherein each transistor has a source region, a drain region, and body region;

fabricating a pair of load devices on the first portion of the substrate, using CMOS technology, wherein each load device couples to a drain region of a respective one of the first transistor and the second transistor;

coupling a first and a second output to the analog differential amplifier circuit, wherein coupling a first and a second output to the analog differential amplifier circuit includes coupling each output between one of the pair of load devices and one of the drain regions for either the first transistor or the second transistor, respectively; and fabricating a common mode feedback circuit on a second portion of the substrate, using CMOS technology, wherein the common mode feedback circuit includes an output which couples to the first and the second transistors.

24. The method of claim 23, wherein fabricating a first amplifying circuit having a first transistor and a second transistor of a first conductivity type includes fabricating a first amplifying circuit having a first transistor and a second transistor of a first conductivity type each having a threshold voltage (VT) which is less than 0.1 Volts.

* * * * *